(12) United States Patent
Liu

(10) Patent No.: US 9,531,355 B1
(45) Date of Patent: Dec. 27, 2016

(54) CLOCK PHASE SHIFT CIRCUIT

(71) Applicant: STMicroelectronics (Shenzhen) R&D Co. Ltd, Shenzhen (CN)

(72) Inventor: Yong Feng Liu, Shenzhen (CN)

(73) Assignee: STMICROELECTRONICS (SHENZHEN) R&D CO. LTD, Shenzhen (CN)

( * ) Notice: Subject to any disclaimer, the term of this patent is extended or adjusted under 35 U.S.C. 154(b) by 0 days.

(21) Appl. No.: 14/754,778

(22) Filed: Jun. 30, 2015

(30) Foreign Application Priority Data

Jun. 17, 2015 (CN) .......................... 2015 1 0337146

(51) Int. Cl.
*H03K 4/06* (2006.01)
*H03K 4/502* (2006.01)
*H03K 5/00* (2006.01)
*H03K 3/017* (2006.01)

(52) U.S. Cl.
CPC .............. *H03K 4/502* (2013.01); *H03K 3/017* (2013.01); *H03K 5/00* (2013.01); *H03K 2005/00202* (2013.01)

(58) Field of Classification Search
CPC F02M 26/01; F02P 2017/125; F02P 2017/128
See application file for complete search history.

(56) References Cited

U.S. PATENT DOCUMENTS

2014/0104952 A1\* 4/2014 Takeuchi ............... G11C 16/06
365/185.17

OTHER PUBLICATIONS

Gregoire, B. Robert: "A Sub 1-V Constant Gm-C Switched-Capacitor Current Source," IEEE Transaction on Circuits and Systems, II: Express Briefs, vol. 54, No. 3, Mar. 2007, pp. 222-226.

\* cited by examiner

*Primary Examiner* — Sibin Chen
(74) *Attorney, Agent, or Firm* — Gardere Wynne Sewell, LLP

(57) ABSTRACT

An electronic device includes a first circuit to generate an output control signal when a first voltage across a first capacitor receiving an input current exceeds a threshold voltage, in response to an input signal having a first logic level. The input current is proportional to a frequency of the input signal. A second circuit is to generate an output reset signal when a second voltage across a second capacitor receiving the input current exceeds the threshold voltage, in response to the input signal having a second logic level. A flip flop is to generate a signal output as having the first logic level in response to the output control signal, and to reset and generate the signal output as having the second logic level in response to the output reset signal.

22 Claims, 3 Drawing Sheets

CLOCK PHASE SHIFT CIRCUIT

PRIORITY CLAIM

This application claims priority from Chinese Application for Patent No. 201510337146.X filed Jun. 17, 2015, the disclosure of which is incorporated by reference.

TECHNICAL FIELD

This application is directed to the field of electronics, and, more particularly, to a circuit to shift the phase of a clock signal.

BACKGROUND

Electronics devices such as computers, laptops, smartphones, tablets, televisions, and the like may have a need to shift the phase of a clock signal. Current circuits to shift the phase of the clock signal typically employ a D-type flip flop that has a D input, a Q output, and a trigger input. The D-type flip flop receives the clock signal at its D input, and a signal at its trigger input that corresponds to an inverted form of the clock signal with its frequency doubled. This circuit produces a version of the clock signal that is phase shifted by 90 degrees.

While this described phase shifting circuit may be useful in some situations, it suffers from the drawback that the phase shift is determined by the signal at its trigger input. Generation of the necessary signal at the trigger input to provide a desired phase shift may involve the use of a phase locked loop, and the associated complexity (as well as on-chip space) that is associated therewith.

Therefore, new circuits that shift the phase of the clock in other ways are desirable.

SUMMARY

An electronic device includes a first circuit being configured to generate an output control signal when a first voltage across a first capacitor receiving an input current exceeds a threshold voltage, in response to an input signal having a first logic level. The input current is proportional to a frequency of the input signal. A second circuit is configured to generate an output reset signal when a second voltage across a second capacitor receiving the input current exceeds the threshold voltage, in response to the input signal having a second logic level. A flip flop is configured to generate a signal output as having the first logic level in response to the output control signal, and to reset and generate the signal output as having the second logic level in response to the output reset signal.

A conversion circuit may be configured to receive an input signal and to generate the input current, with the input current being proportional to a frequency of the input signal and to a conversion capacitor. A time for the first voltage to exceed the threshold voltage is based upon a first ratio, with the first ratio being a ratio of a capacitance of the first capacitor to a capacitance of the conversion capacitor. The signal output differs in phase from the input signal based upon the first ratio.

The first and second capacitors may have a same capacitance.

A time for the second voltage to exceed the threshold voltage is based upon a second ratio, with the second ratio being a ratio of a capacitance of the second capacitor to the capacitance of the conversion capacitor. The signal output differs in duty cycle from the input signal based upon the second ratio.

An enable circuit may be configured to enable the first circuit when the input signal has the first logic level and disable the first circuit when the input signal has the second logic level, and to enable the second circuit when the input signal has the second logic level and disable the second circuit when the input signal has the first logic level. The enable circuit may include a first inverter coupled to receive the input signal and to output an inverted version thereof to the first circuit, and a second inverter coupled to the first inverter to receive the inverted version of the input signal and to output an inverted version thereof to the second circuit.

The first circuit may include a first transistor in a current mirror relationship with an output transistor of the conversion circuit such that the input current may flow therethrough, and a first node. A second transistor may be configured to selectively allow the flow of the input current through the first transistor to flow through the second transistor and into the first node when the input signal has the first logic level. The first capacitor is configured to be charged by the input current flowing through the first node. A comparator is configured to compare a voltage at the first node to the threshold voltage and to generate the output control signal when the voltage at the first node exceeds the threshold voltage. The voltage at the first node is the first voltage across the first capacitor.

A first current sink circuit may be configured to sink current from the first node based upon the input signal having the second logic level. The first current sink circuit may include a third transistor comprising a first NMOS transistor having a source coupled to ground, a drain coupled to the first node, and a gate coupled to receive an inverse of the input signal. The first current sink circuit may also include a fourth transistor comprising a second NMOS transistor having a source coupled to ground, a drain coupled to the first node, and a gate coupled to the signal output.

The first transistor may be a first PMOS transistor having a source coupled to a power supply, a drain, and a gate coupled to a gate of the output transistor. The second transistor may be a second PMOS transistor having a source coupled to the drain of the first PMOS transistor, a drain coupled to the first capacitor, and a gate coupled to an inverse of the input signal.

The second circuit may include a fifth transistor in a current mirror relationship with an output transistor of the conversion circuit such that the input current may flow therethrough, and a second node. A sixth transistor may be configured to selectively allow the flow of the input current through the fifth transistor to flow through the sixth transistor and into the second node when the input signal has the second logic level. A comparator may be configured to compare a voltage at the second node to the threshold voltage and to generate the output reset signal when the voltage at the second node exceeds the threshold voltage. The voltage at the second node may be the second voltage across the second capacitor.

A second current sink circuit may be configured to sink current from the second node based upon the input signal having the first logic level. The second current sink may include a seventh transistor comprising a third NMOS transistor having a drain coupled to the second node, a source coupled to ground, and a gate coupled to the input signal.

The fifth transistor may be a third PMOS transistor having a source coupled to the power supply, a drain, and a gate coupled to the gate of the output transistor. The sixth transistor may be a fourth PMOS transistor having a source coupled to the drain of the fifth transistor, a drain coupled to the second node, and a gate coupled to the clock signal.

A method aspect may include generating a clock current based upon a clock signal. On a rising edge of the clock signal, the method may include generating an output control signal when a first voltage across a first capacitor receiving the clock current exceeds a threshold voltage, wherein a time for the first voltage to exceed the threshold voltage is based upon the clock current and the first capacitor. On a falling edge of the clock signal, the method may include generating an output reset signal when a second voltage across a second capacitor receiving the clock current exceeds the threshold voltage. A clock output may be generated as logic high in response to the output control signal. The clock output may be reset to low based upon the output reset signal.

DETAILED DESCRIPTION

One or more embodiments of communication systems in accordance with the principles of the present invention will be described below. These described embodiments are only examples of techniques to implement the invention, as defined solely by the attached claims. Additionally, in an effort to provide a focused description of the invention and the principles of the invention, irrelevant features of an actual implementation may not be described in the specification.

Figure 1:
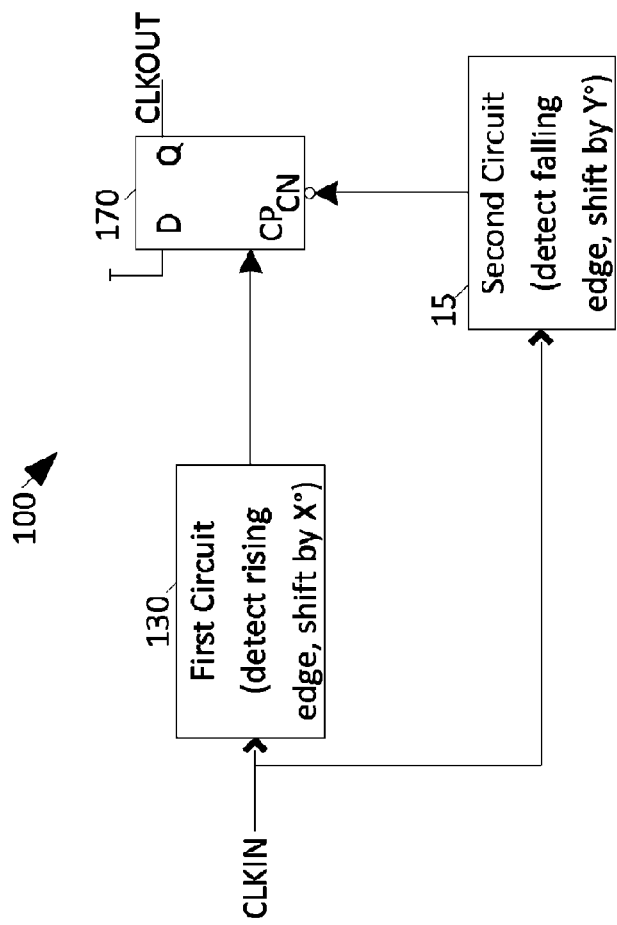
FIG. 1 is a schematic block diagram of a phase shifting circuit in accordance with this disclosure.

With reference to FIG. 1, a phase shifting circuit 100 for an input signal, such as a clock signal, is now described. Operation of the phase shifting circuit 100 will now be described in general, and thereafter more specific operation details will be given.

The phase shifting circuit 100 includes a flip flop 170 for generating a signal output CLKOUT. The flip flop 170 receives a voltage representing a logic high at its D input, and provides the signal output CLKOUT at its Q output. The flip flop 170 is clocked by a first circuit 130, and is reset by a second circuit 150. The first and second circuits 130, 150 receive a clock signal CLKIN as input.

When the clock signal CLKIN transitions to logic high, the first circuit 130 generates an output control signal whose rising edge clocks the flip flop 170. The rising edge of the output control signal is delayed with respect to the rising edge of the clock signal CLKIN, and therefore serves to generate a rising edge of the signal output CLKOUT that has its phase shifted with respect to the clock signal CLKIN by a value of $X°$.

When the clock signal CLKIN transitions to logic low, the second circuit 150 generates an output reset signal having a falling edge to reset the flip flop 170. The falling edge of the output reset signal is delayed with respect to the falling edge of the clock signal CLKIN, and therefore serves to generate a falling edge of the signal output CLKOUT that has its phase shifted with respect to the input signal by a value of $Y°$.

The delay of the output control signal set by the first circuit 130 therefore shifts the phase of the signal output CLKOUT with respect to the clock signal CLKIN by $X°$. Similarly, the delay of the output reset signal set by the second circuit 150 alters the duty cycle of the signal output CLKOUT with respect to the clock signal CLKIN. If $X°=Y°$, then the duty cycle is not changed.

Figure 2:
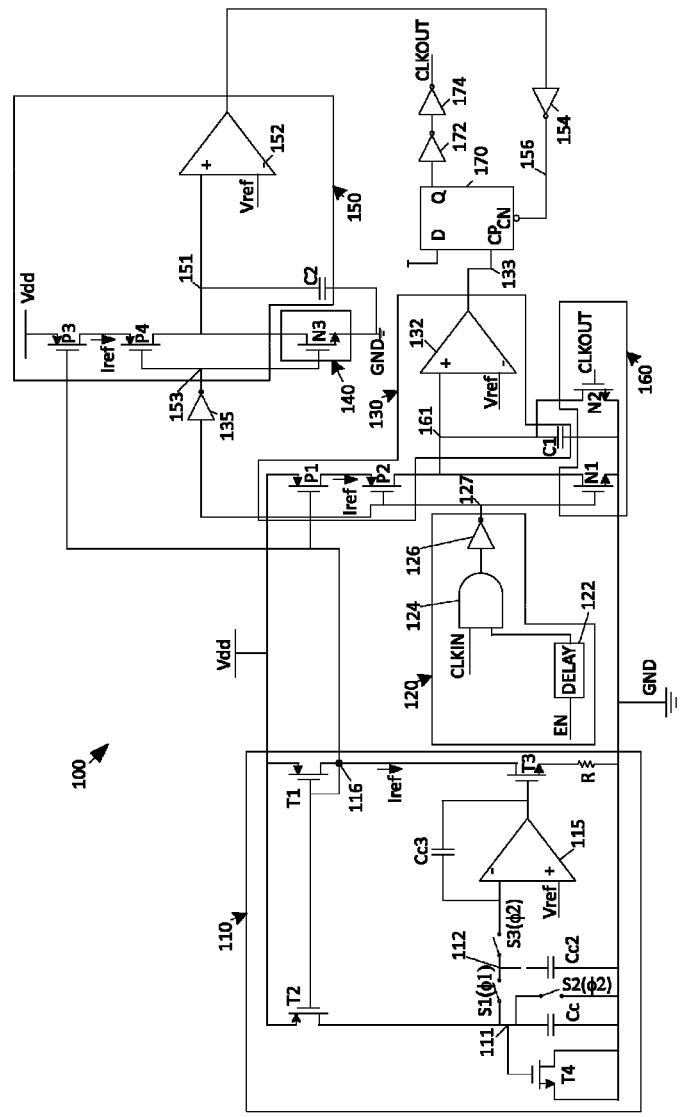
FIG. 2 is a circuit schematic diagram of a phase shifting circuit in accordance with this disclosure.

Further details of the phase shifting circuit 100 are now given with reference to FIG. 2. A conversion circuit 110 comprises a conversion capacitor Cc and a switch S2($\phi$2) coupled in parallel between a node 111 and ground. A NMOS compensation transistor T4 has a gate coupled to the node 111, and a source and drain both coupled to ground GND. The NMOS transistor T4 serves to compensate capacitors C1 and C2. A switch S1($\phi$1) is coupled between the node 111 and a second node 112. An additional conversion capacitor Cc2 is coupled between the node 112 and ground GND. An operational amplifier 115 has an inverting terminal coupled to through a switch S3($\phi$2) to node 112, and a non-inverting terminal coupled to a reference voltage Vref. A feedback capacitor Cc3 is coupled between the inverting input and output of the operational amplifier 115.

A NMOS transistor T3 has a gate coupled to the output of the operational amplifier 115, a source coupled to ground GND via a resistor R, and a drain coupled to a node 116. A PMOS transistor T1 has a source coupled to a power supply voltage Vdd, a drain coupled to the node 116, and a gate also coupled to node 116. A PMOS transistor T2 has a source coupled to the power supply voltage Vdd, a drain coupled to node 111, and a gate coupled to the node 116.

During operation of the conversion circuit 110, the switches S1($\phi$1), S2($\phi$2), and S3($\phi$2), are triggered according to the clock CLKIN. The $\phi$ on each switch denotes when that switch transitions. $\phi$1 represents one logic state of the clock, and $\phi$2 represents the other logic state of the clock. $\phi$1 and $\phi$2 are non-overlapping clock control signals derived from input signal CLKIN. During $\phi$2, the switches S2($\phi$2) and S3($\phi$2) close while the switch S1($\phi$1) is open, and the capacitor Cc discharges to ground. At the same time, the voltage across Cc2 is forced to ground by Vref. During $\phi$1, the switch S1($\phi$1) closes, while the switches S2($\phi$2) and S3($\phi$2) are opened. Thus, the operational amplifier 115 provides a constant voltage to the gate of the transistor T3, which pulls a constant current through transistor T1 and into the node 116. This constant current is mirrored to T2, and flows through capacitors Cc and Cc2. Thus, the constant current is provided to the capacitors Cc and Cc2 by the current mirror arrangement formed by the transistors T1 and T2, thereby charging the capacitors Cc and Cc2.

When the transition to $\phi$2 occurs, the switch S1($\phi$1) opens, while the switches S2($\phi$2) and S3($\phi$2) close. The capacitor Cc2 is then discharged into the feedback capacitor Cc3 at the same time as Cc is discharged to ground. If the voltage across Cc2 is greater than Vref, the voltage output by the operational amplifier 115 will decrease when Cc is discharged to ground, causing a reduction in the constant current. If the voltage across Cc2 is less than Vref, the voltage output by the operational amplifier 115 will increase, causing an increase in the constant current. This increase or decrease in the steady state current affects how quickly the capacitors Cc and Cc2 charge up. Ultimately, once the conversion circuit 110 reaches a steady state, the voltage across Cc2 will be equal to Vref, and the constant current can be described mathematically as:

$$I = 2V_{REF} C_c F_{CLKIN}$$

This steady state current is proportional to both the frequency of the input signal and the capacitance of the capacitor Cc, and is referred to herein as the clock current or input current.

The first circuit 130 includes a first PMOS transistor P1 that has its source coupled to the power supply Vdd, and its gate coupled to the node 116. A second PMOS transistor P2 has its source coupled to the drain of the first PMOS transistor P1, its gate coupled to node 127, and its drain coupled to node 161. A comparator 132 has its non-inverting terminal coupled to node 161, and its inverting terminal coupled to the reference voltage Vref. A first capacitor C1 is coupled between the node 161 and ground.

A first current sink circuit 160 includes a first NMOS transistor N1 having its drain coupled to the node 161, its source coupled to ground, and its gate coupled to node 127. A second NMOS transistor N2 has its drain coupled to node 161, its source coupled to ground GND, and its gate coupled to receive the signal output CLKOUT.

A second circuit 150 includes a third PMOS transistor P3, which has its source coupled to the power supply Vdd, and its gate coupled to node 116. A fourth PMOS transistor P4 has its source coupled to the drain of the third PMOS transistor P3, its gate coupled to inverter 135 at node 153, and its drain coupled to the node 151. A comparator 152 has its non-inverting terminal coupled to the node 151, and its inverting terminal coupled to the reference voltage Vref. A second capacitor C2 is coupled between the node 151 and ground GND. A second current sink circuit 140 includes a third NMOS transistor N3 having its drain coupled to the node 151, its source coupled to ground GND, and its gate coupled to node 153.

As will be explained, the input current is utilized by the first circuit 130 and second circuit 150. However, the conversion circuit 110 should be in a steady state before the current is so utilized. Therefore, an enable circuit 120 is used to, in part, delay usage of the input current by the first circuit 130 and second circuit 150.

The enable circuit 120 is includes an AND gate 124, which receives at its inputs the input signal CLKIN, and a delayed version of an enable signal EN. An inverter 126 is coupled to the output of the AND gate 124 via node 127. When the input signal CLK is high and enable signal is asserted, and after the delay of the enable signal imposed by the delay block 122, the AND gate 124 outputs a logic high, which is then inverted by inverter 126. The output of the inverter 126 is passed to another inverter 135 via node 153.

In operation, the first PMOS transistor P1 mirrors the input current through the transistor T1 of the conversion circuit. When the input signal is high, the enable circuit 120 outputs a logic low to node 127, which serves to turn on the second PMOS transistor P2, and turn off the first NMOS transistor N1. The input current thus flows from the first PMOS transistor P1, through the second PMOS transistor P2, into the first capacitor C1 at node 161, and charges up the first capacitor C1. When the voltage across the first capacitor C1 is greater than the reference voltage Vref, the comparator 132 outputs a logic high to the clock input CP of the flip flop 132 at node 133, which then latches a logic high value from the input D of the flip flop 132 to the output Q of the flop flop 132. This output is then inverted twice by the inverters 172 and 174, and is output as the phase shifted clock output CLKOUT.

The time for the voltage across the capacitor C1 to exceed the reference voltage Vref is a function of the value of the input current and the capacitor C1, and thus dependent upon a ratio of the capacitance of the capacitor C1 to the capacitor Cc. This time can be calculated as:

$$T_{Delay} = \frac{C1 * Vref}{I(P1)} = \frac{C1 * Vref}{\frac{2 * Vref * Cc}{T_{clkin}}} = \frac{1}{2} * \frac{C1}{Cc} * T_{clkin}$$

Thus, the amount of phase shift X° as a result of the time delay is easily adjustable by selecting the value of the capacitors C1 and Cc.

When the input signal transitions low, the logic high at node 127 turns on the first NMOS transistor N1 and turns off P2. This serves to discharge the capacitor C2 to ground. Since the comparator 132 will then see ground at its non-inverting terminal and the reference voltage Vref at its inverting terminal, it will output a logic low to the clock input CP of the flip flop 170. In addition, when the signal output CLKOUT is high, the second NMOS transistor N2 turns on, further helping to discharge the first capacitor C1 to ground.

In addition, when the input signal goes low, the enable circuit 120 outputs a logic high to node 127, which is then inverted by the inverter 135, which serves to turn on the fourth PMOS transistor P4 and turn off the third NMOS transistor N3. This allows the input current, mirrored from transistor T1 to the third PMOS transistor P3, to flow through the fourth PMOS transistor P4. The input current thus flows through the capacitor C2, charging C2. When the voltage across C2 exceeds the reference voltage Vref, the comparator 152 outputs a logic high, which is then inverted by the inverter 154, and fed to the reset input CN of the flip flop 170 at node 156. This resets the flip flop 170, pulling the output low, and thus the signal output CLKOUT low.

The time for the voltage across the capacitor C2 to exceed the reference voltage Vref is a function of the value of the input current and the capacitor C2, and thus is based upon a ratio of the capacitance of the capacitor C2 to the capacitor Cc. This time can be calculated as:

$$T_{Delay} = \frac{C2 * Vref}{I(P3)} = \frac{C2 * Vref}{\frac{2 * Vref * Cc}{T_{clkin}}} = \frac{1}{2} * \frac{C2}{Cc} * T_{clkin}$$

Thus, the amount of phase shift Y° which causes adjustment in duty cycle is easily alterable by selecting the value of the capacitors C2 and Cc.

Figure 3:
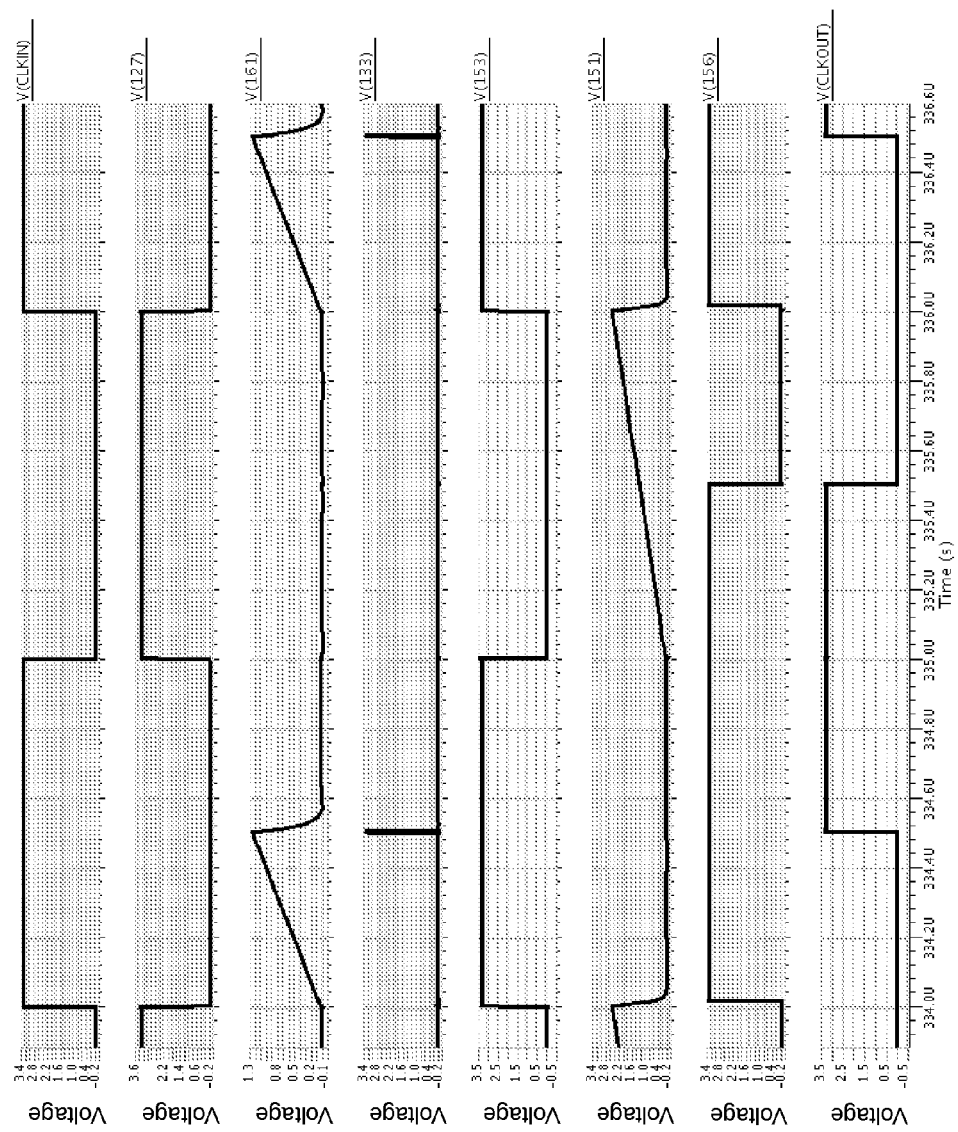
FIG. 3 is a timing diagram of the phase shifting circuit of FIG. 1 in operation.

A timing diagram showing the various signals of the phase shifting circuit 100 in operation is depicted by FIG. 3. In particular, FIG. 3 shows CLKIN, the voltage at nodes 127, 161, 133, 153, 151, and 156, and CLKOUT.

While the disclosure has been described with respect to a limited number of embodiments, those skilled in the art, having benefit of this disclosure, will appreciate that other embodiments can be envisioned that do not depart from the scope of the disclosure as disclosed herein. Accordingly, the scope of the disclosure shall be limited only by the attached claims.

The invention claimed is:

1. An electronic device, comprising:
  a conversion circuit configured to receive an input signal and to generate an input current, the input current being proportional to a frequency of the input signal and to a capacitance of a conversion capacitor;
a first circuit configured to generate an output control signal when a first voltage across a first capacitor receiving the input current exceeds a threshold voltage, in response to the input signal having a first logic level,
a second circuit configured to generate an output reset signal when a second voltage across a second capacitor receiving the input current exceeds the threshold voltage, in response to the input signal having a second logic level; and
a flip flop configured to generate a signal output as having the first logic level in response to the output control signal, and to reset and generate the signal output as having the second logic level in response to the output reset signal.

2. The electronic device of claim 1, wherein a time for the first voltage to exceed the threshold voltage is based upon a first ratio, the first ratio being a ratio of a capacitance of the first capacitor to a capacitance of the conversion capacitor.

3. The electronic device of claim 2, wherein the signal output differs in phase from the input signal based upon the first ratio.

4. The electronic device of claim 1, wherein first and second capacitors have a same capacitance.

5. The electronic device of claim 1, wherein a time for the second voltage to exceed the threshold voltage is based upon a second ratio, the second ratio being a ratio of a capacitance of the second capacitor to the capacitance of the conversion capacitor; and wherein the signal output differs in duty cycle from the input signal based upon the second ratio.

6. The electronic device of claim 1, further comprising an enable circuit configured to enable the first circuit when the input signal has the first logic level and disable the first circuit when the input signal has the second logic level, and to enable the second circuit when the input signal has the second logic level and disable the second circuit when the input signal has the first logic level.

7. The electronic device of claim 6, wherein the enable circuit comprises a first inverter coupled to receive the input signal and to output an inverted version thereof to the first circuit; and further comprising a second inverter coupled to the first inverter to receive the inverted version of the input signal and to output an inverted version thereof to the second circuit.

8. An electronic device comprising:
a first circuit configured to generate an output control signal when a first voltage across a first capacitor receiving an input current exceeds a threshold voltage, in response to an input signal having a first logic level;
a second circuit configured to generate an output reset signal when a second voltage across a second capacitor receiving the input current exceeds the threshold voltage, in response to the input signal having a second logic level; and
a flip flop configured to generate a signal output as having the first logic level in response to the output control signal, and to reset and generate the signal output as having the second logic level in response to the output reset signal;
wherein the first circuit comprises:
a first transistor in a current mirror relationship with an output transistor of the conversion circuit such that the input current may flow therethrough;
a first node;
a second transistor configured to selectively allow the flow of the input current through the first transistor to flow through the second transistor and into the first node when the input signal has the first logic level;
wherein the first capacitor is configured to be charged by the input current flowing through the first node; and
a comparator configured to compare a voltage at the first node to the threshold voltage and to generate the output control signal when the voltage at the first node exceeds the threshold voltage;
wherein the voltage at the first node is the first voltage across the first capacitor.

9. The electronic device of claim 8, further comprising a first current sink circuit configured to sink current from the first node based upon the input signal having the second logic level.

10. The electronic device of claim 9, wherein the first current sink circuit comprises:
a third transistor comprising a first NMOS transistor having a source coupled to ground, a drain coupled to the first node, and a gate coupled to receive an inverse of the input signal;
a fourth transistor comprising a second NMOS transistor having a source coupled to ground, a drain coupled to the first node, and a gate coupled to the signal output.

11. The electronic device of claim 8, wherein:
the first transistor comprises a first PMOS transistor having a source coupled to a power supply, a drain, and a gate coupled to a gate of the output transistor; and
the second transistor comprises a second PMOS transistor having a source coupled to the drain of the first PMOS transistor, a drain coupled to the first capacitor, and a gate coupled to an inverse of the input signal.

12. An electronic device comprising;
a first circuit configured to generate an output control signal when a first voltage across a first capacitor receiving an input current exceeds a threshold voltage, in response to an input signal having a first logic level;
a second circuit configured to generate an output reset signal when a second voltage across a second capacitor receiving the input current exceeds the threshold voltage, in response to the input signal having a second logic level; and
a flip flop configured to generate a signal output as having the first logic level in response to the output control signal, and to reset and generate the signal output as having the second logic level in response to the output reset signal;
wherein the second circuit comprises:
a fifth transistor in a current mirror relationship with an output transistor of the conversion circuit such that the input current may flow through;
a second node;
a sixth transistor configured to selectively allow the flow of the input current through the fifth transistor to flow through the sixth transistor and into the second node when the input signal has the second logic level;
a comparator configured to compare a voltage at the second node to the threshold voltage and to generate the output reset signal when the voltage at the second node exceeds the threshold voltage;
wherein the voltage at the second node is the second voltage across the second capacitor.

13. The electronic device of claim 12, further comprising a second current sink circuit configured to sink current from the second node based upon the input signal having the first logic level.

14. The electronic device of claim 13, wherein the second current sink circuit comprises:
a seventh transistor comprising a third NMOS transistor having a drain coupled to the second node, a source coupled to ground, and a gate coupled to the input signal.

15. The electronic device of claim 12, wherein:
the fifth transistor comprises a third PMOS transistor having a source coupled to a power supply, a drain, and a gate coupled to the gate of the output transistor;
the sixth transistor comprises a fourth PMOS transistor having a source coupled to the drain of the fifth transistor, a drain coupled to the second node, and a gate coupled to the input signal.

16. An electronic device, comprising:
a reference current generator to receive a clock signal and comprising a transistor having a control terminal;
an inverter coupled to the clock signal;
a first circuit comprising:
 a first PMOS transistor having a source coupled to a power supply voltage, a drain, and a gate coupled to the control terminal of the transistor,
 a second PMOS transistor having a source coupled to the drain of the first PMOS transistor, a drain coupled to a first node, and a gate coupled to the inverter,
 a first capacitor coupled between the first node and ground,
 a first comparator having a non-inverting terminal coupled to the first node, an inverting terminal coupled to a reference voltage, and an output;
a flip flop having an input coupled to a logic high voltage, an output, a clock input coupled to the output of the first comparator, and a reset input.

17. The electronic device of claim 16, further comprising:
a first current sink circuit comprising:
a first NMOS transistor having a drain coupled to the first node, a source coupled to ground, and a gate coupled the reference current generator, and
a second NMOS transistor having a drain coupled to the first node, a source coupled to ground, and a gate coupled to the output of the flip flop.

18. The electronic device of claim 16, further comprising a second circuit comprising:
a third PMOS transistor having a source coupled to the power supply voltage, a drain, and a gate terminal coupled to the control terminal of the transistor;
a fourth PMOS transistor having a source coupled to the drain of the third PMOS transistor, a drain coupled to a second node, and a gate coupled to the clock signal;
a second capacitor coupled between the second node and ground;
a second comparator having a non-inverting terminal coupled to the second node, an inverting terminal coupled to the threshold voltage, and an output;
an output inverter coupled between the output of the second comparator and the reset input of the flip flop.

19. The electronic device of claim 18, further comprising:
a second current sink circuit comprising a third NMOS transistor having a drain coupled to the second node, a source coupled to ground, and a gate coupled to the inverter.

20. A method, comprising:
generating a clock current proportional to a frequency of a clock signal and a capacitance of a conversion capacitor;
on a rising edge of the clock signal, generating an output control signal when a first voltage across a first capacitor different from the conversion capacitor and receiving the clock current exceeds a threshold voltage, wherein a time for the first voltage to exceed the threshold voltage is based upon the clock current and the first capacitor;
on a falling edge of the clock signal, generating an output reset signal when a second voltage across a second capacitor different from the conversion capacitor and receiving the clock current exceeds the threshold voltage;
generating a clock output as logic high in response to the output control signal; and
resetting the clock output to low based upon the output reset signal.

21. The method of claim 20, further comprising setting a phase difference between the clock output and the clock signal by adjusting a capacitance of the first capacitor.

22. The method of claim 20, wherein a time for the second voltage to exceed the threshold voltage is based upon the clock current and a second capacitor; and further comprising setting a duty cycle difference between the clock output and the clock signal by adjusting the second capacitor.

* * * * *